(12) United States Patent
Huang et al.

(10) Patent No.: US 9,711,502 B2
(45) Date of Patent: Jul. 18, 2017

(54) DOUBLE-SIDE PROCESS SILICON MOS AND PASSIVE DEVICES FOR RF FRONT-END MODULES

(71) Applicant: SEMICONDUCTOR MANUFACTURING INTERNATIONAL (SHANGHAI) CORPORATION, Shanghai (CN)

(72) Inventors: Herb He Huang, Shanghai (CN); Cliff Drowley, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/345,135

(22) Filed: Nov. 7, 2016

(65) Prior Publication Data

US 2017/0053907 A1 Feb. 23, 2017

Related U.S. Application Data

(62) Division of application No. 14/839,907, filed on Aug. 28, 2015, now abandoned, which is a division of
(Continued)

(30) Foreign Application Priority Data

Jun. 18, 2013 (CN) .......................... 2013 1 0242363

(51) Int. Cl.
*H01L 21/762* (2006.01)
*H01L 27/06* (2006.01)
(Continued)

(52) U.S. Cl.
CPC ........ *H01L 27/0694* (2013.01); *B81B 7/0006* (2013.01); *B81C 1/00333* (2013.01);
(Continued)

(58) Field of Classification Search
CPC ............ H01L 27/0694; H01L 29/7816; H01L 27/1207; H01L 23/48; H01L 28/10;
(Continued)

(56) References Cited

U.S. PATENT DOCUMENTS 9,147,598 B2 9/2015 Huang et al.
2005/0095779 A1 5/2005 Park et al.
(Continued)

OTHER PUBLICATIONS

U.S. Appl. No. 14/084,597, Notice of Allowance mailed on May 26, 2015, 8 pages.
(Continued)

*Primary Examiner* — Benjamin Sandvik
*Assistant Examiner* — Damon Hillman
(74) *Attorney, Agent, or Firm* — Kilpatrick Townsend & Stockton LLP

(57) ABSTRACT

An integrated circuit includes a first semiconductor substrate having a first surface and a second surface opposite to the first surface, at least one first trench extending into the first semiconductor substrate from the first surface and having a first depth, at least one second trench extending into the first semiconductor substrate from the first surface and having a second depth greater than the first depth, a thinned semiconductor region with a first recessed region extending in the first semiconductor substrate from the second surface and having a first thickness, a second recessed region in the first semiconductor substrate extending from the second surface to the first surface, and a bulk dielectric layer covering the second surface of the first semiconductor substrate.

12 Claims, 14 Drawing Sheets

Related U.S. Application Data application No. 14/084,597, filed on Nov. 19, 2013, now Pat. No. 9,147,598.

(51) Int. Cl.

| | | |
|---|---|---|
| *B81C 1/00* | (2006.01) | |
| *H01L 23/48* | (2006.01) | |
| *B81B 7/00* | (2006.01) | |
| *H01L 21/768* | (2006.01) | |
| *H01L 21/84* | (2006.01) | |
| *H01L 23/528* | (2006.01) | |
| *H01L 27/12* | (2006.01) | |
| *H01L 49/02* | (2006.01) | |
| *H01L 29/66* | (2006.01) | |
| *H01L 29/78* | (2006.01) | |
| *H01L 23/522* | (2006.01) | |

(52) U.S. Cl.
CPC .. *H01L 21/76224* (2013.01); *H01L 21/76229* (2013.01); *H01L 21/76251* (2013.01); *H01L 21/76802* (2013.01); *H01L 21/76877* (2013.01); *H01L 21/84* (2013.01); *H01L 23/481* (2013.01); *H01L 23/528* (2013.01); *H01L 23/5226* (2013.01); *H01L 27/0629* (2013.01); *H01L 27/1207* (2013.01); *H01L 28/10* (2013.01); *H01L 28/40* (2013.01); *H01L 29/66681* (2013.01); *H01L 29/7816* (2013.01); *B81B 2207/015* (2013.01); *B81C 2203/0118* (2013.01); *B81C 2203/0735* (2013.01); *H01L 23/5223* (2013.01); *H01L 23/5227* (2013.01); *H01L 2924/0002* (2013.01)

(58) Field of Classification Search
CPC ..... H01L 28/40; H01L 29/7817; H01L 27/00; H01L 25/00; H01L 21/84; H01L 21/76224; H01L 21/76877; H01L 21/76229; H01L 23/5226
See application file for complete search history.

(56) References Cited

U.S. PATENT DOCUMENTS

| | | | |
|---|---|---|---|
| 2007/0296002 A1* | 12/2007 | Liang | H01L 21/84 257/288 |
| 2012/0126394 A1* | 5/2012 | Huang | H01L 21/6835 257/737 |
| 2014/0291860 A1* | 10/2014 | Stuber | H01L 23/481 257/774 |
| 2014/0367753 A1* | 12/2014 | Huang | H01L 29/66477 257/288 |
| 2014/0367777 A1 | 12/2014 | Huang et al. | |
| 2015/0368095 A1 | 12/2015 | Huang et al. | |

OTHER PUBLICATIONS

U.S. Appl. No. 14/084,597, Restriction Requirement mailed on Apr. 14, 2015, 7 pages.
U.S. Appl. No. 14/839,907, Non-Final Office Action mailed on Jun. 17, 2016, 8 pages.

* cited by examiner

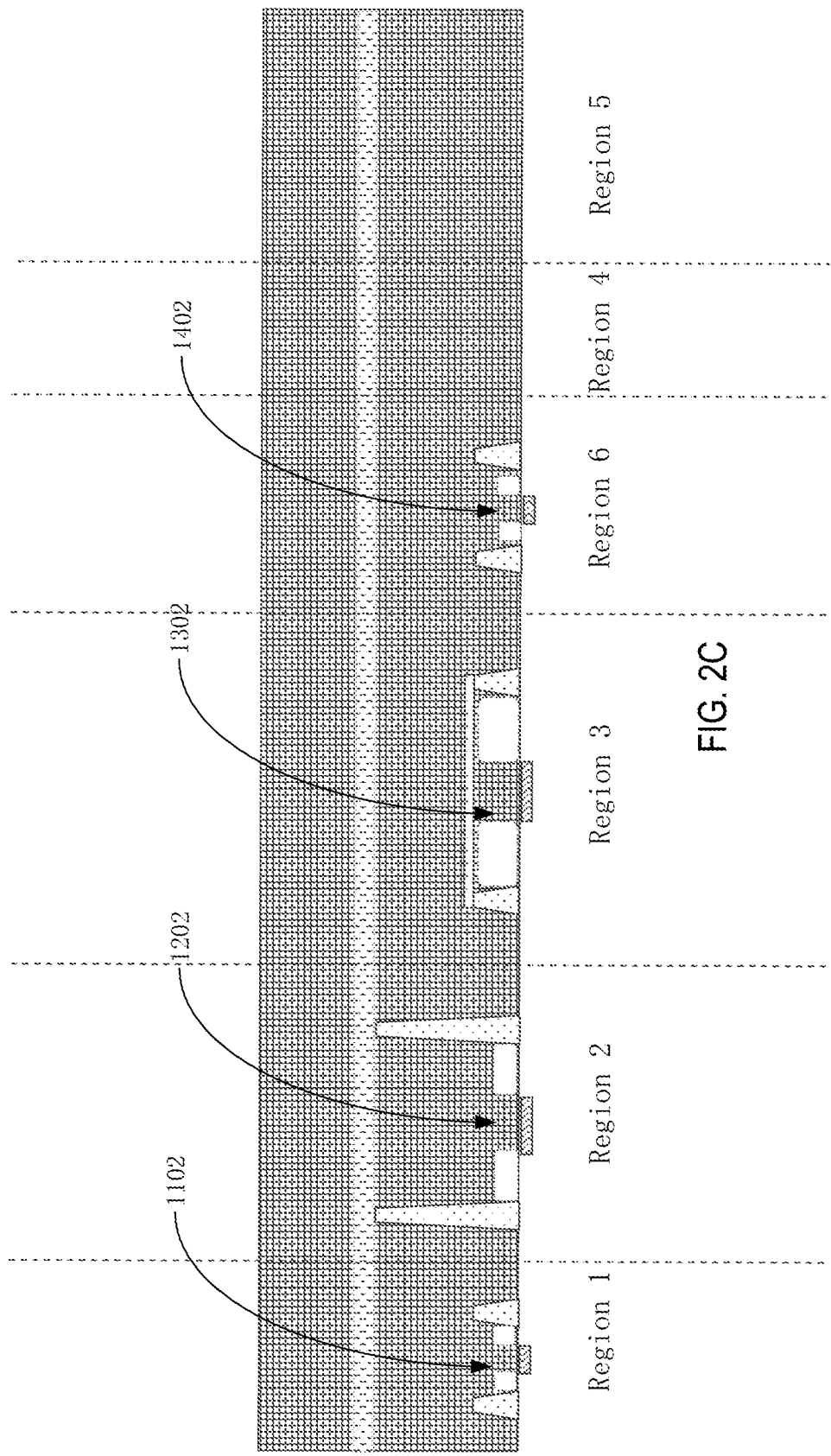

S101 : Provide a first semiconductor substrate having a first surface and a second surface; Form a horizontal isolation layer 1300 in the third region and at a first depth from the first surface.

S102 : Form shallow trench isolation in region 1 and region 3; Form deep trench isolation in region 2.

S103 : Form first set of transistors in regions 1 and 3; Form second set of transistors in region 2; The transistors are formed on the first surface side.

S104 : Etch the substrate from the second surface side to a first recessed region to expose the horizontal isolation layer in the region 3

S105 : Form dielectric at second surface side of substrate; and planarize to form body dielectric layer to cover second surface side of substrate and to fill the first recessed region

FIG. 3

DOUBLE-SIDE PROCESS SILICON MOS AND PASSIVE DEVICES FOR RF FRONT-END MODULES

CROSS-REFERENCES TO RELATED APPLICATIONS

This application is a divisional application of U.S. patent application Ser. No. 14/839,907, filed on Aug. 28, 2015, which is a divisional application of U.S. patent application Ser. No. 14/084,597, filed on Nov. 19, 2013, which claims priority to Chinese Patent Application No. 201310242363.1, filed on Jun. 18, 2013, commonly owned and incorporated herein by reference in their entirety for all purposes.

BACKGROUND OF THE INVENTION

The present invention relates to semiconductor integrated circuits. In particular, embodiments of the present invention relate to integrated circuit devices having RF front-end modules.

In the field of semiconductor technology, radio frequency frond-end module (RF FEM) is a key component in wireless communication devices, such as mobile phones, tablet computers, etc. In general, the RF front-end module typically includes components formed in different integrated circuit chips, such as chips for power amplifier core, power amplifier controller (PA controller), tuners RF, filters, duplexers, envelope tracking modules, etc. The amplifier core usually is made in a gallium arsenide (GaAs) chip or high voltage (HV) and high power complementary metal-oxide semiconductor (CMOS) chip, the amplifier controller typically is made in CMOS chips, radio tuners are usually made in CMOS chips, RF switches are often made in silicon-on-insulator metal oxide semiconductor field effect transistors (SOI MOS), filters are typically radio frequency integrated passive devices using radio frequency (RF IPD), duplexers are usually made in micro-electromechanical systems (MEMS), while the other chip (such as an envelope detector chip) may be CMOS chips. These conventional RF front-end modules are often made by connecting a number of different chips in a system in package (SiP), often using wire bonding techniques.

BRIEF SUMMARY OF THE INVENTION

The inventors have observed that conventional RF front-end modules tend to suffer from many drawback, such as large size, low signal to noise ratio (SNR), higher power consumption, and other shortcomings. In addition, conventional system-level packaging methods tend to have high process complexity and high manufacturing cost.

Embodiments of the present invention provide an integrated circuit and associated processes for integrating components for RF front-end modules, including various transistors and different passive devices, on a single semiconductor substrate, utilizing both sides of the substrate. Depending on the embodiments, one or more of the following benefits can be achieved, such as smaller device size, higher signal-to-noise ratio, lower power consumption, etc., as compared with conventional methods. Further, the integrated process reduces the complexity and manufacturing cost of the RF system.

According to some embodiments of the invention, a method for forming integrated circuit includes providing a first semiconductor substrate having a front surface and a back surface that is opposite to the front surface, also referred to as the first and second surfaces, respectively. One or more first trenches are disposed in the first semiconductor substrate from the front surface side, the first trenches being characterized by a first depth. One or more second trenches are formed in the first semiconductor substrate from the front surface side, the second trenches being characterized by a second depth which is greater than the first depth. A horizontal isolation layer is formed parallel to the front surface and at a third depth from the front surface. The method also includes forming a first recessed region extending in the first semiconductor substrate from the back surface side to the horizontal isolation layer that results in a thinned semiconductor region having a thickness substantially equal to the third depth. The method further includes forming a bulk or body dielectric layer covering the back surface side of the first semiconductor substrate.

In an embodiment of the above method, forming the first recessed region includes bonding a second substrate on top of the first surface of first substrate, thinning the backside of the first substrate, and etching the backside semiconductor to form the first recessed region to expose the horizontal isolation layer. In another embodiment, thinning the backside of the first substrate comprises etch the backside of the substrate to expose a bottom portion of the one or more of the second trenches to form a first active region isolated by dielectrics on the sides and at the bottom. In another embodiment, the method also includes forming a laterally-diffused MOS transistor in the first active region.

In another embodiment of the method, the bulk dielectric layer includes a first protruding portion extending into the first recessed region, and first protruding portion of the bulk dielectric layer is in contact with the one or more first trenches in the thinned semiconductor region to form a second active region isolated by dielectrics on the sides and at the bottom. In another embodiment, the method also includes forming a fully depleted semiconductor on insulator (SOI) transistor in the second active region.

In yet another embodiment, the method includes forming a second recessed region in the first semiconductor substrate from the back surface side, and the second recessed region extends to the front surface. In other words, the semiconductor is completely removed in this region. In an embodiment, the bulk dielectric layer includes a second protruding portion extending into the second recessed region, and the method further includes forming one or more conductive vias through the second protruding portion of the bulk dielectric layer. In an embodiment, the method includes forming one or more of an integrated capacitor and an integrated inductor disposed on the second surface side of the substrate. In one embodiment, the method also includes forming an interconnect structure for coupling the one or more of the integrated capacitors and integrated inductors to one or more components on the first surface side of the substrate through one or more conductive vias disposed in the second protruding portion of the bulk dielectric layer.

In another embodiment, the method includes forming one or more MEMS (micro-mechanical-electrical-system) devices disposed on the second surface side of the substrate. In an embodiment, the method also includes forming an interconnect structure for coupling the one or more of the MEMS devices to a component on the first surface side of the substrate through one or more conductive vias disposed in the second protruding portion of the dielectric layer.

According to alternative embodiments of the invention, an integrated circuit, includes a first semiconductor substrate having a first surface and a second surface that is opposite to the first surface, one or more first trenches having a first depth extending into the first semiconductor substrate from the first surface side, and one or more second trenches extending into the first semiconductor substrate from the first surface side, the second trenches being characterized by a second depth which greater than the first depth. The integrated circuit also includes a thinned semiconductor region with a first recessed region extending in the first semiconductor substrate from the second surface side, the thinned semiconductor region being characterized by a first thickness, a second recessed region in the first semiconductor substrate extending from the second surface side to the first surface, and a bulk dielectric layer covering the second surface side of the first semiconductor substrate.

In an embodiment of the integrated circuit, the bulk dielectric layer is in contact with the one or more second trenches to form a first active region isolated by dielectrics on the sides and at the bottom. In an embodiment, the integrated circuit also has a laterally-diffused MOS transistor in the first active region.

In another embodiment of the integrated circuit, the bulk dielectric layer also includes a first protruding portion extending into the first recessed region and a second protruding portion extending into the second recessed region. In an embodiment, the first protruding portion of the bulk dielectric layer is in contact with the one or more first trenches in the thinned semiconductor region to form a second active region isolated by dielectrics on the sides and at the bottom. In another embodiment, the integrated circuit also has a fully depleted semiconductor on insulator (SOI) transistor in the second active region.

In another embodiment of the integrated circuit, the integrated circuit also includes one or more conductive vias extending through the second protruding portion of the bulk dielectric layer. In an embodiment, the integrated circuit also includes one or more of an integrated capacitor and an integrated inductor disposed on the second surface side of the substrate. In another embodiment, the integrated circuit also includes an interconnect structure for coupling the one or more of the integrated capacitor and the integrated inductor to one or more component on the first surface side of the substrate through one or more conductive vias disposed in the second protruding portion of the bulk dielectric layer. In another embodiment, the integrated circuit also has one or more MEMS (micro-mechanical-electrical-system) devices disposed on the second surface side of the substrate. In another embodiment, the integrated circuit also includes an interconnect structure for coupling the one or more of the MEMS devices to a component on the first surface side of the substrate through one or more conductive vias disposed in the second protruding portion of the dielectric layer.

A further understanding of the nature and advantages of the present invention may be realized by reference to the remaining portions of the specification and the drawings.

BRIEF DESCRIPTION OF THE DRAWINGS

FIGS. 2A-2J are cross-sectional diagrams illustrating a method for forming an integrated circuit according to embodiments of the present invention;

FIG. 3 is a flowchart illustrating a method for manufacturing an integrated circuit according to an embodiment of the present invention.

DETAILED DESCRIPTION OF THE INVENTION

Figure 1A:
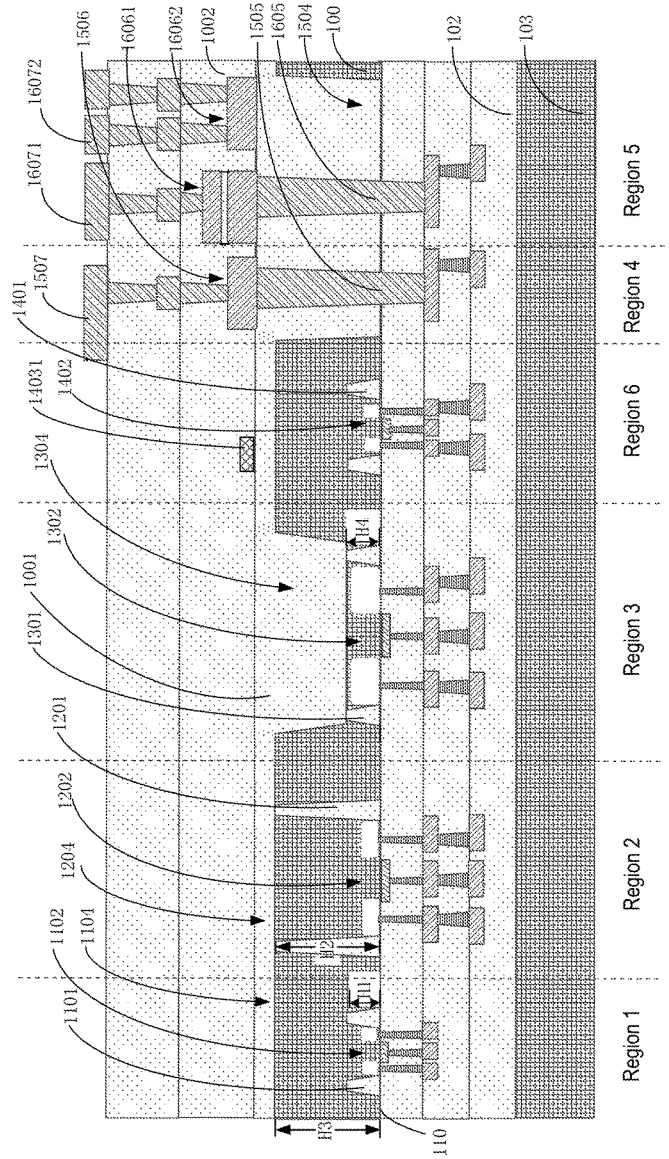
FIGS. 1A and 1B are simplified cross-sectional diagrams illustrating an integrated circuit according to embodiments of the present invention.

In the following description, numerous specific details are given in order to provide a more thorough understanding of the embodiments of the present invention. However, it is appreciated that one or more details can be omitted. In other examples, some technical characteristics known in the art are not described for simplicity. The preferred embodiment of the present invention is described below in detail, but the present invention can have other embodiments in addition to those described in detail.

It should be understood that in the drawings, for clarity, the relative dimensions of layers and regions may be altered. The same reference numerals are used to identify the same components throughout the disclosure, if possible.

It is also noted that when an element or layer is referred to as "on . . . the . . . ," " adjacent to", "connected to" or "coupled to" another element or layer, it can be directly on the other element or layer, adjacent, connected or coupled to the other element or layer or, alternatively, intervening elements or layers may be present. In contrast, when an element is referred to as being "directly . . . on," "directly adjacent with . . . ," "directly connected to" or "directly coupled to" another element or layer, there are no intervening elements or layer. Further, although the terms first, second, third, etc. may be used to describe various elements, components, areas, layers and/or sections, these elements, components, areas, layers and/or sections should not be limited by these terms. These terms are only used to distinguish one element, component, region, layer or section from another element, component, region, layer or section. Therefore, without departing from the teachings of the present invention below, the following discussion of a first element, component, region, layer or section may be expressed as a second element, component, region, layer or section.

The term regarding spatial relationships such as "lower," "below," "under," and "on," "above," etc., are used for convenience of description to describe the relationship of one element or feature to another element or feature in a figure. It should be understood that in addition to the orientation shown in the figure, the spatial relationship terms are intended to include different orientations during use and operation. For example, if the device in the figures is rotated, then what is described as "below" or "beneath" or "under" may become "on" or "above" or "over." Thus, the term "below" and "under" may include both upper and lower orientations. Device may additionally be oriented differently (e.g., rotated 90 degrees or other orientations), and the spatial relationship used in this description are interpreted accordingly.

The terminology used herein is intended only for the purpose of describing particular embodiments and is not a limitation of the invention. As used herein, the singular forms "a", "an" and "said/the" are intended to include the plural forms, unless the context clearly points out differently. It is also understood that the terms "is composed of" and/or "comprising" are used in this specification to identify the included features, integers, steps, operations, elements, and/or components, but do not exclude one or more additional features, integers, steps, operations, elements, components, and/or groups. As used herein, the term "and/or" includes any of the associated listed items and all combinations thereof.

Herein the preferred embodiments of the present invention and intermediate structures are illustrated using schematic diagrams or cross-sectional diagrams. Thus, variations in shapes can be expected as manufacturing techniques and/or tolerances may vary. Thus, embodiments of the present invention should not be limited to the particular shapes of regions illustrated, but includes the shapes that result, for example, from manufacturing deviations. For example, an implanted region shown as a rectangle at its edges in a drawing can also have rounded or curved features and/or a gradient of implant concentration, rather than a binary change from implanted to non-implanted regions. Similarly, a buried region formed by implantation may result in the injection being present in the intermediate regions between the buried region and the surface. Thus, the shapes in the figure are illustrative in nature and are not intended to restrict the actual shape of the region and not intended to limit the scope of the invention.

Figure 1B:
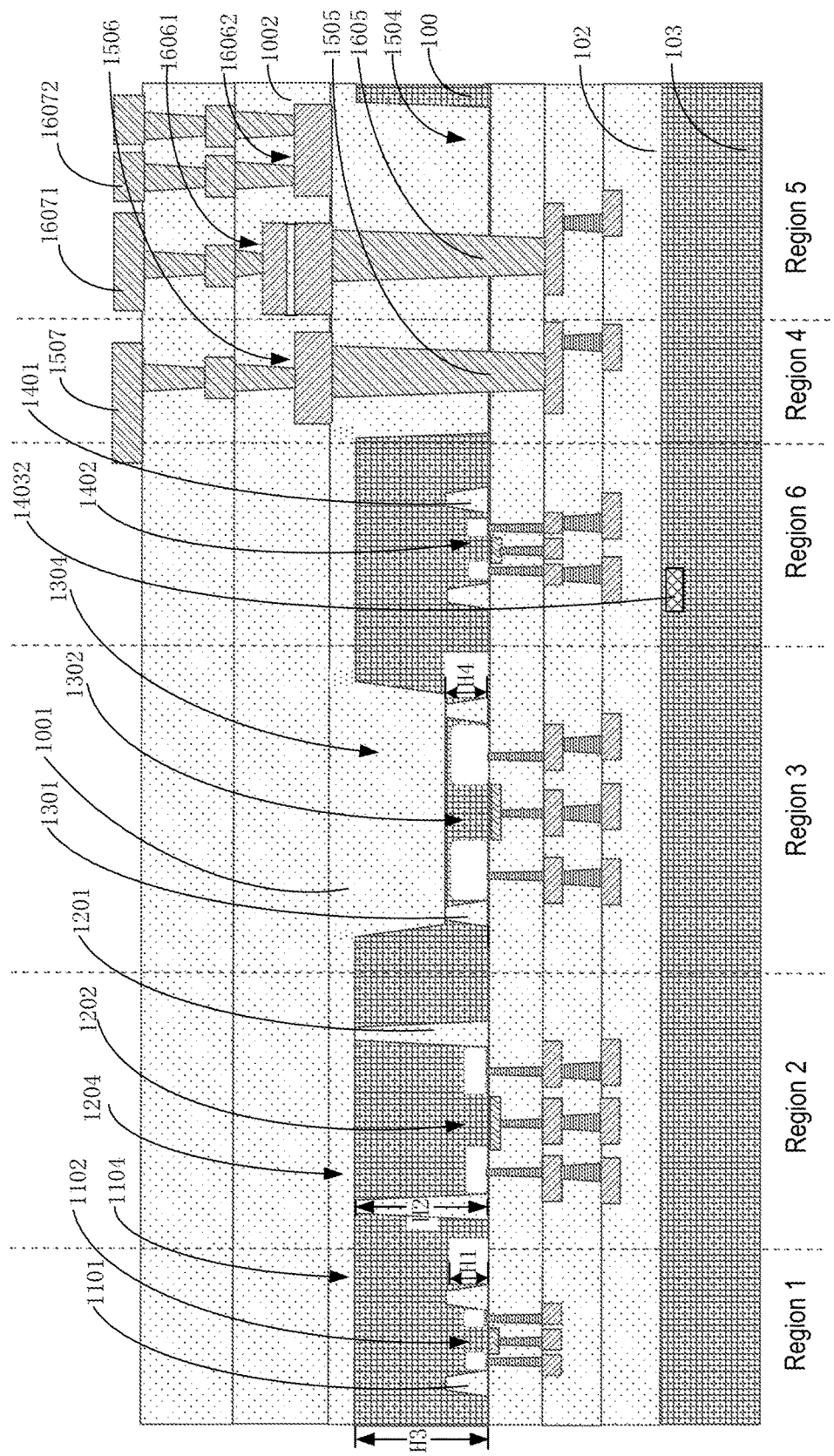

FIGS. 1A and 1B are simplified cross-sectional diagrams illustrating an integrated circuit according to embodiments of the present invention. FIG. 1A shows an integrated circuit that can be used in an integrated radio frequency front end module (RF FEM) for a communication device such as a mobile phone. As shown in FIG. 1A, the integrated circuit of this embodiment includes a first semiconductor substrate 100 having a first surface 110 and a first body or bulk dielectric layer 1001 formed in the first semiconductor substrate 100 on a second surface side opposite to first surface 110. Note that first surface 110 is usually referred to as the front surface of the substrate and, in this notation, first body dielectric layer 1001 would be formed on the backside of the substrate. For easy of illustration, substrate 100 is shown upside down in the drawings to show that the integrated circuit has active devices on one side of the substrate and passive and MEMS devices formed on the other side. The embodiments are described using a silicon substrate. But it is understood that other suitable substrates can also be used, such as germanium or a compound semiconductor such as GaAs.

A first set of transistors 1102 in a first region of substrate 100 are core MOS transistors, usually low-voltage MOS transistors. A second set of transistors 1202 in a second region of substrate 100 are high-voltage MOS transistors (HV MOS), for example, LDMOS transistors (i.e., laterally diffused MOS transistors). A third set of transistors 1302 in a third region of substrate 100 are fully depleted MOS transistors (FD MOS), for example, semiconductor on insulator (SOI) transistors. It is understood that each set of transistors can include a plurality of the respective transistors, even though only one is shown in each region in FIG. 1A.

In region 1 of FIG. 1A, the first set of transistors 1102 are isolated by a first set of shallow trench isolation (STI) structures 1101, which extend from the first surface 110 to a depth of H1. The bottom portion of the first set of transistors 1102 are isolated by a portion 1104 of body dielectric layer 1001 in region 1. Substrate 100 in region 1 has a depth of H3. In region 2, the second set of transistors 1202 are isolated by a first set of deep trench isolation (DTI) structures 1201, which extend from the first surface 110 to a depth of H2. The bottom portion of the second set of transistors 1202 are isolated by a portion 1204 of body dielectric layer 1001 in region 2. Substrate 100 in region 2 has a depth of H3. In region 3, the third set of transistors 1302 are isolated by a second set of shallow trench isolation (STI) structures 1301, which extend from the first surface 110 to a depth of H4. The bottom portion of the second set of transistors 1202 are isolated by a protruding portion 1304 of body dielectric layer 1001 in region 3. The top surface of the protruding portion 1304 coincide with a bottom surface of substrate 100 in region 3 which has a depth of H4.

In this embodiment, the second depth H2 is greater than the first depth H1. The third depth H3 is greater than the fourth depth H4. The third depth H3 is greater than or equal to the second depth H2. The fourth depth H4 is greater than or equal to the first depth H1. The third depth H3 is less than or equal to the thickness of the first semiconductor substrate 100. The first set of shallow trench isolation (STI) 1101, the first set of the deep trench isolation (DTI) 1201, and the second set shallow trench isolation (STI) 1301 can be regarded as an isolation wall of the groups of transistors (the side walls). The first dielectric body layer 1001 can be considered the bottom of each set of transistors. Put it another way, the first set of transistors, the second set of transistors, and the third set of transistors can have different side wall and bottom insulations.

In this embodiment, the first surface 110 of the semiconductor substrate 100 is the front side of the substrate and refers to the substrate surface where the transistors are formed. The second surface is the back side of the substrate, which is the surface of the substrate opposite to the first surface. As used herein, the word "depth" can also mean "distance," and is calculated using the first surface of substrate as a reference.

As shown in FIG. 1A, in region 6 of the first semiconductor substrate 100, a fourth group of transistors 1402 are formed and are isolated by a third set of shallow trench isolation (STI) 1401. The bottom of transistors 1401 are isolated by a bottom portion of the first body dielectric layer 1001. The thickness of the substrate in region 6 is H3. Therefore, the body dielectric 1001 in region 6 is at the depth H3 from the first surface of the substrate. In an embodiment, the fourth set of transistors 1402 have the same structures as the first group of transistors 1102, and can also be used as core transistors. In this example, region 6 can be considered as part of region 1. In this embodiment, micro-electromechanical system (MEMS) device 14031 can be provided on the fourth set of transistors 1402 and, in particular, micro-electromechanical systems (MEMS) device 14031 may be provided in a second dielectric layer 1002 above the body dielectric layer 1001.

As shown in FIG. 1A, in regions 4 and 5 of the first semiconductor substrate 100, through-semiconductor-vias (TSV) 1505 and 1506 are formed. TSV 1505 and TSV 1605 are disposed in dielectric layer 1504, which is the portion of the first dielectric layer 1001 formed extending through the first semiconductor substrate 100 in regions 4 and 5. The front surface and the back surface of dielectric 1504 are at the same horizontal position as the first and second surface of substrate 100. In this embodiment, TSV 1505 and TSV 1605 are configured to connect devices on the first surface (front) and the second surface (back surface) of first semiconductor substrate 100. Further, it is understood that one or more TSVs can be formed in region 4 or region 5, even though one is shown in each region. In some embodiments, the first dielectric layer 1001 is a single dielectric layer or multi-layer dielectric.

As shown in FIG. 1A, the integrated circuit can also include one or more integrated passive devices (IPD) formed in region 5 of semiconductor substrate 100. The integrated passive device can include one or more capacitors 16061 and one or more inductors 16062. In this embodiment, the integrated passive devices are disposed on the first body dielectric layer 1001. In FIG. 1A, capacitor 16061 is connected to components through via 1505 on the first surface of the substrate, also called the front or upper surface.

In some embodiments, the integrated circuit can also include includes a second substrate 103, which is used as a carrier substrate. An adhesive layer 102 is used to bond carrier substrate 103 with the interlayer dielectric layer or another layer on the first surface of substrate 100. The carrier substrate 103 can be used as part of the integrated circuit package.

In this embodiment, the integrated circuit further includes backend metal interconnect structures for connecting the transistors, pad structures on the back surface (such as pads 1506, 1507, 16071, and 16072, and the intermediate connection pads, etc.). The integrated circuit also includes interlayer dielectric layers and intermetallic dielectric layer structure shown in FIG. 1A.

Depending on the embodiment, the integrated circuit can include two or more of the first set of transistors 1102, the second set of transistors 1202, the third group of transistors 1302, the fourth group of transistors 1402, the integrated passive devices, and MEMS devices. The integrated circuit also can be integrated with various other components. For example, the integrated circuit may include only the first group of transistors 1102 and the second set of transistors 1202, or include only the first set of transistors 1102 and the third set of transistors 1302, etc.

FIG. 1B is a simplified cross-sectional diagrams illustrating an integrated circuit according to alternative embodiments of the present invention. The integrated circuit in FIG. 1B is similar to the integrated circuit described above in FIG. 1A. One difference is that a micro-electromechanical systems (MEMS) device 14032 is disposed on a carrier substrate, the second semiconductor substrate 103. In embodiments of the invention, the micro-electromechanical systems (MEMS) devices may be disposed in any other suitable location. For example, the MEMS device can be disposed between the surface of the semiconductor substrate and the second semiconductor substrate, such as a dielectric layer (e.g., an adhesive layer 102), on a dielectric layer on the second dielectric layer 1002 (e.g., interlayer dielectric or inter-metal layer dielectric). The MEMS can also be formed above a metal interconnect layer, over the transistors, or under the transistors. The MEMS device can also be formed in any of the six regions described above. Interconnects between the MEMS devices and other components of the integrated circuit can be formed using known methods and are not described here.

As described above, the integrated circuit according to embodiments of the invention includes various groups of transistors 1102, 1202, 1302, and 1402, integrated passive devices, and MEMS devices and other components. The integrated circuit can be used to implement the RF front-end module (RF FEM) functions. For example, the first set of transistors 1102 may be used to implement the function of a power amplifier controller, the second set of transistors 1202 may be used to implement the function of the power amplifier core, the third group of transistors 1302 may be used to implement the function of the RF switch, the fourth the transistor 1402 can be used to implement the function of the tuner, the MEMS devices can be used to implement a duplex unit, and the integrated passive devices (such as a capacitor and inductor 16061 16062) can be used to implement the filter function. Of course, the present invention is equally applicable to other systems integrated chips, such as CPU, MCU, multi-voltage power system, integrated chips, etc.

The various isolation structures, such as the transistor side wall shallow trenches, deep trenches, and bottom body dielectric structures provide effective isolation. For example, in the examples described above, the second depth H2 is equal to the third depth H3, and the fourth depth H4 is equal to the first depth H1. Therefore, the shallow trenches and the deep trenches are in contact with the bottom body dielectric, forming complete isolation in regions 2 and 3. Therefore, noise between different components is reduced, leading to a higher signal to noise ratio (SNR). The integrated structure also reduces the size of the system. In a specific embodiment, the first distance is 0.01 to 0.5 microns and the second distance is 0.5 to 10 microns. However, other dimensions can also be used.

Figure 2A:
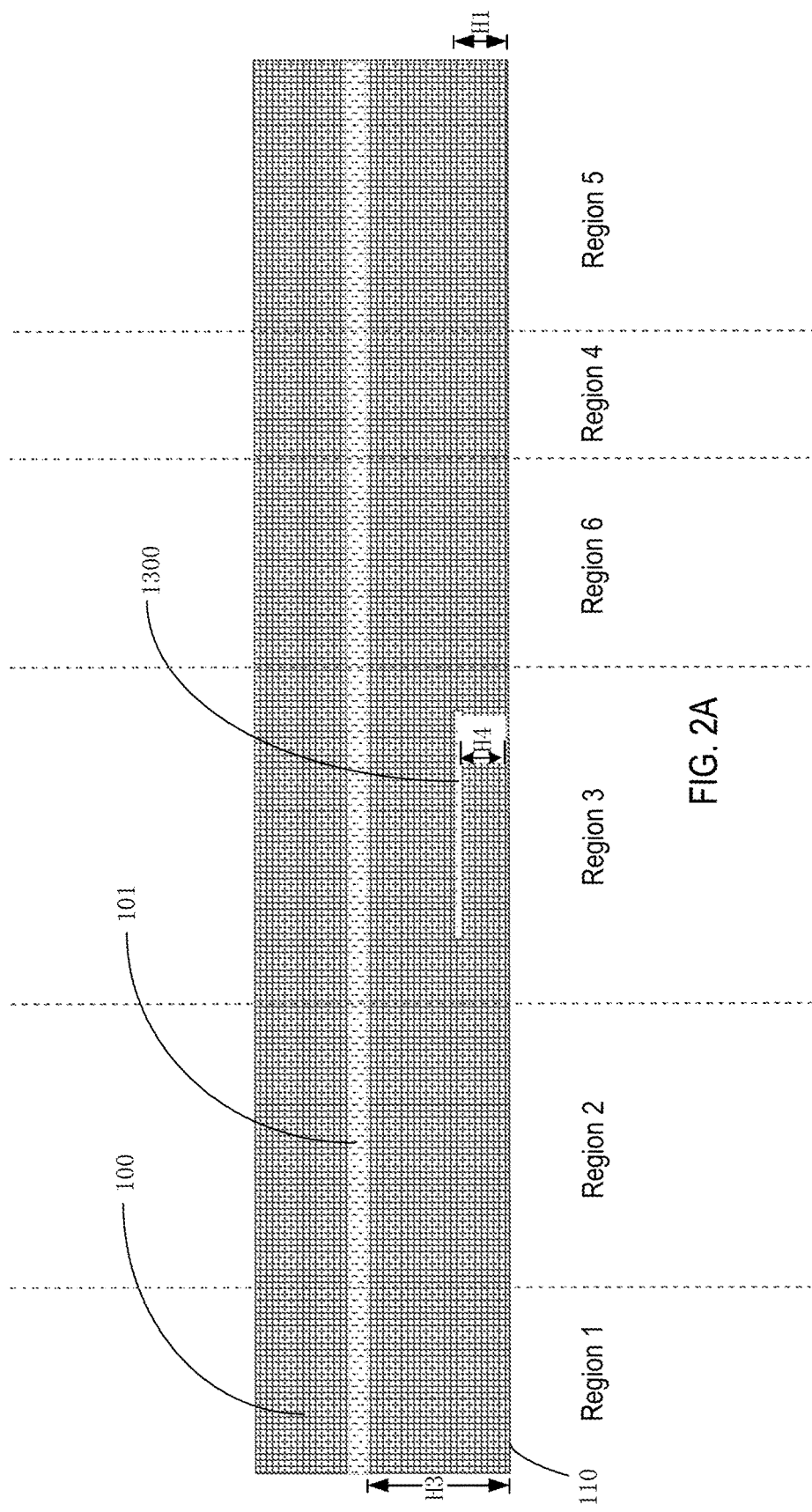

FIGS. 2A-2J are cross-sectional diagrams illustrating a method for forming an integrated circuit according to embodiments of the present invention. In FIG. 2A, a first semiconductor substrate 100, for example, as bulk silicon substrate, has a first surface 110 and is divided into six regions, regions 1-6. In other embodiments, more or less than six regions may be used. A thinning stop layer 101 is formed in the substrate in parallel with first surface 110 at a depth H3 from the first surface. In an embodiment, thinning stop layer 101 can be formed by ion implantation of a suitable ion, for example, oxygen, carbon, nitrogen, or a combination thereof. A high temperature anneal step follows the implantation step. Thinning stop layer 101 is used in a subsequent process to reduce the thickness of the substrate. As shown in FIG. 2A, an island-shaped horizontal isolation layer 1300 is formed at a depth H4 from firs surface 110 and is parallel to first surface 110. Horizontal isolation layer 1300 can be formed using ion implantation and anneal processes similar to the one described above.

Figure 2B:
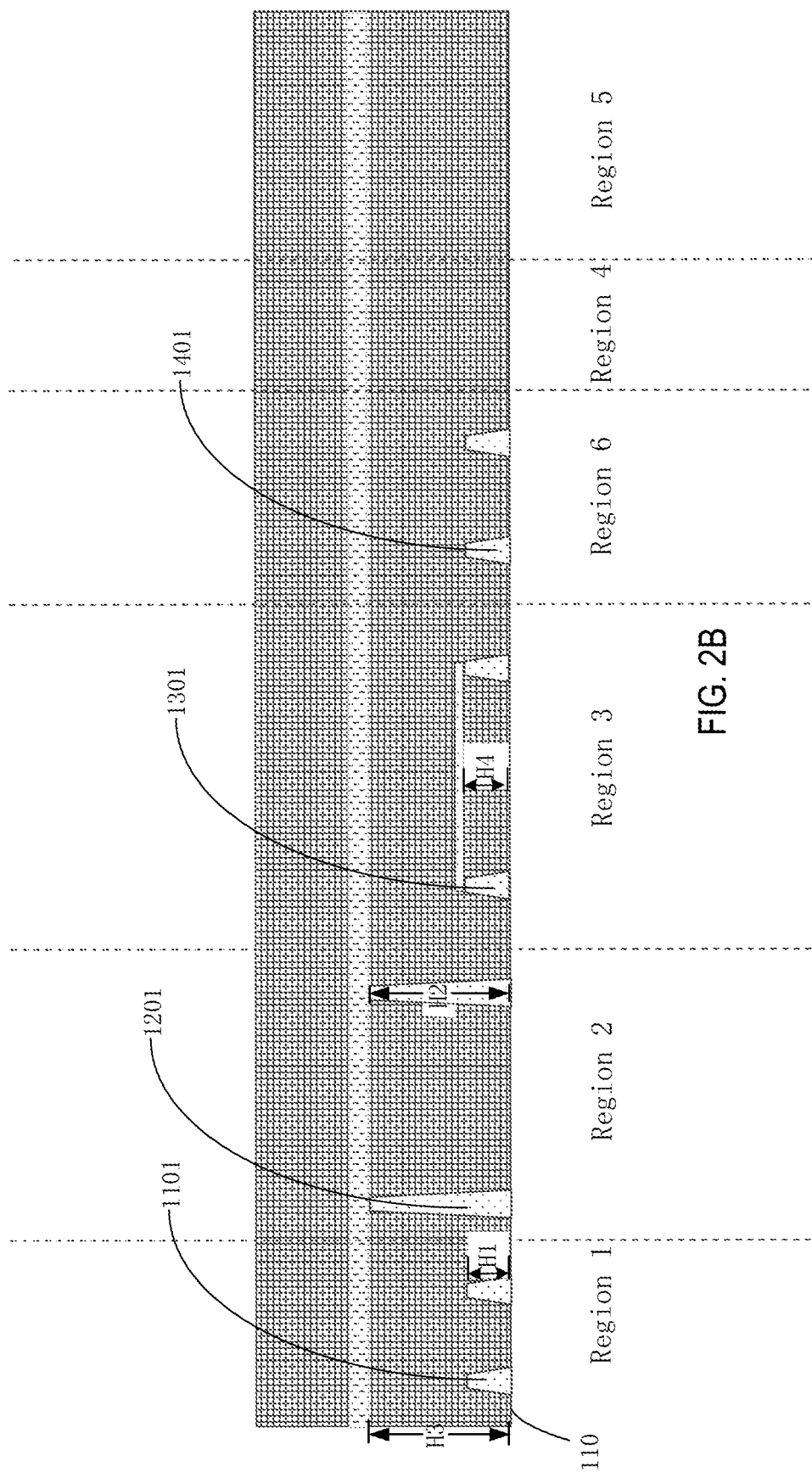

As shown in FIG. 2B, trench isolation regions are formed. For example, shallow trenches 1101 in region 1 have a depth of H1, deep trenches 1201 in region 2 have a depth H2, shallow trenches 1301 in region 3 have a depth H4, and shallow trenches 1401 in region 4 have a depth H1. Depths H1-H4 refer to distances from first surface 110 of the substrate. As shown, depth H2 is greater than depth H1. In an embodiment, shallow trenches 1101, 1301, and 1401 can be formed before forming deep trenches 1201. Both types of trenches can be formed using known substrate etching, dielectric filling, and planarization processes.

In FIG. 2C, various transistors are formed. For example, one or more first set of transistors 1102 are formed in region 1 with shallow trench isolation and can be used as low-voltage core MOS transistors. One or more second set of transistors 1202 are formed in region 2 with deep trench isolation as high voltage MOS transistors (HV MOS). An example of HVMOS is LDMOS. One or more third set of transistors 1302 are formed in region 3 with shallow trench isolation and can be formed as fully depleted MOS transistors (FD MOS). One or more fourth set of transistors 1402 are formed in region 6 with shallow trench isolation and can also be used as core MOS transistors. In an embodiment, MEMS devices can be formed in region 6, rather than region 1. These transistors have gate and source and drain regions shown in FIG. 2C and can be formed using conventional methods. Depending on the embodiments, the different sets of transistors can be formed in different orders.

Figure 2D:
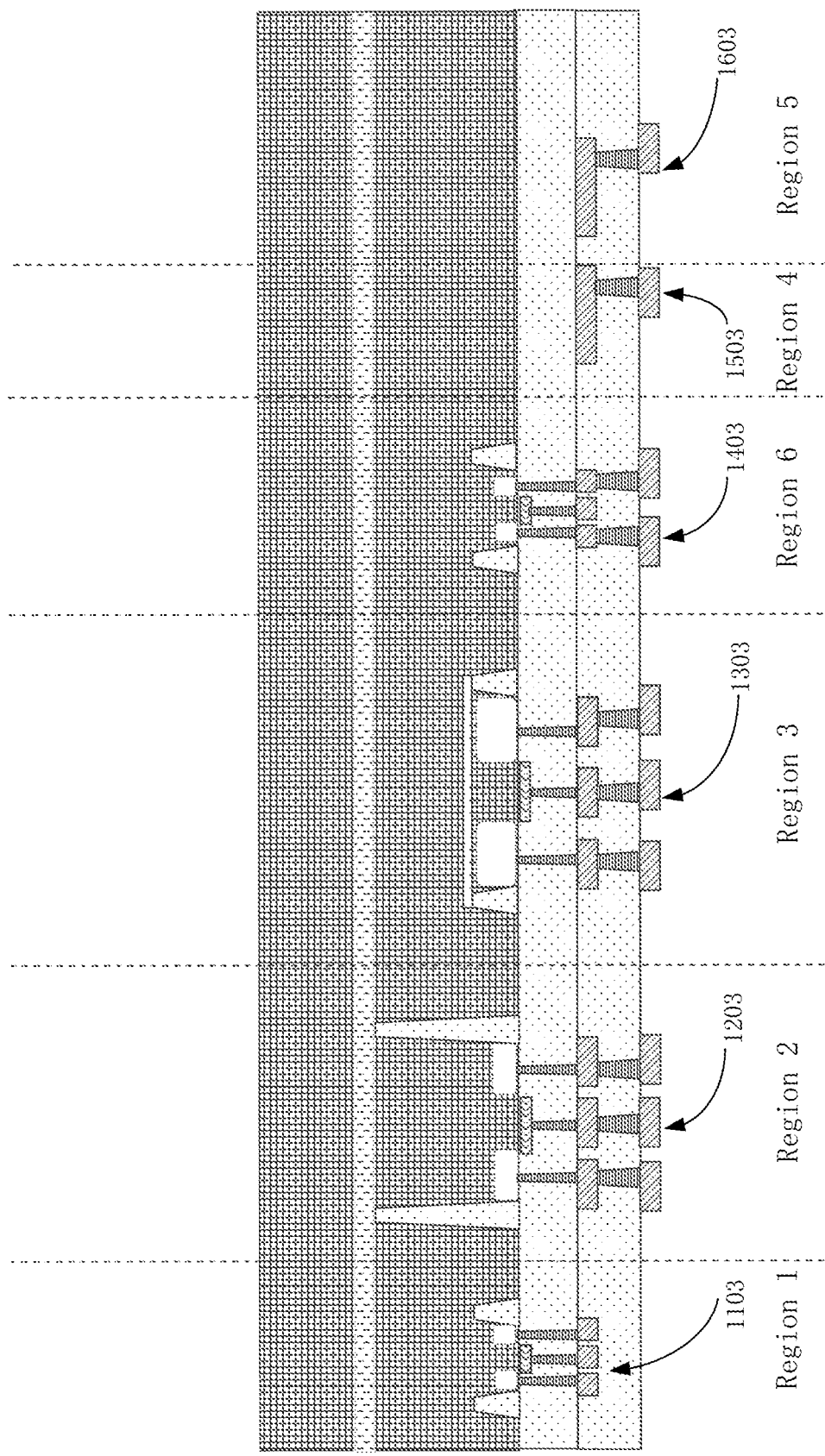

In FIG. 2D, a backend of the line (BOEL) process is used to form interconnect structures. As shown, interconnect structures 1103, 1203, 1303, 1503, 1603, and 1403 are formed in regions 1-6, respectively. Conventional processes can be used the interconnect structures such as interlayer dielectrics, metal layers, etc.

Figure 2E:
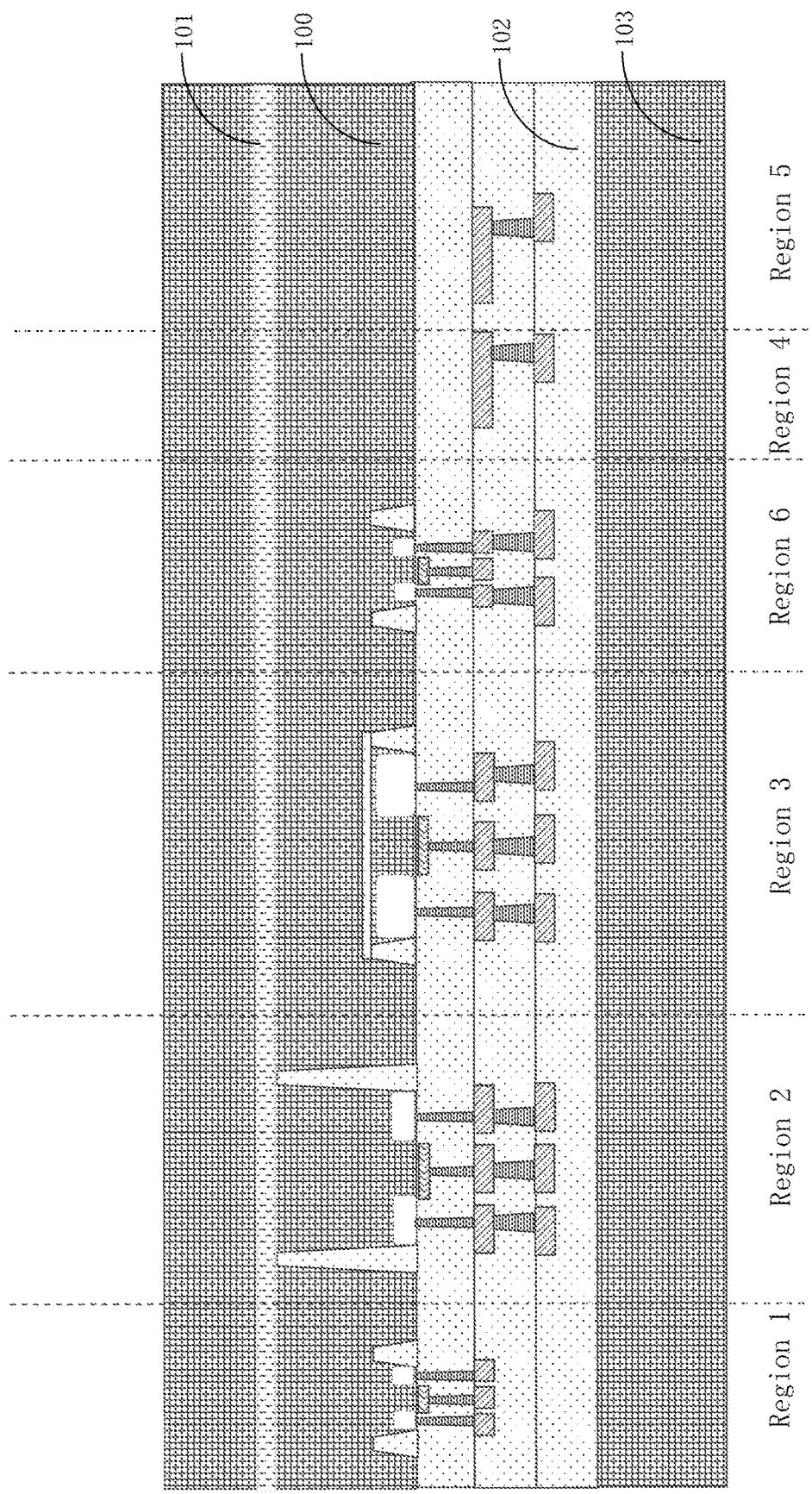

In FIG. 2E, a carrier substrate or second substrate 103 is bonded to first substrate 100 using an adhesive layer 102, which can be made of an oxide layer or another suitable material. Carrier substrate 103 can be a semiconductor substrate or an insulator substrate, and is used for supporting first substrate 100. It can be removed in a subsequent process. Alternatively, carrier substrate 103 can also be kept as part of the package which can reduce packaging material and cost.

Figure 2F:
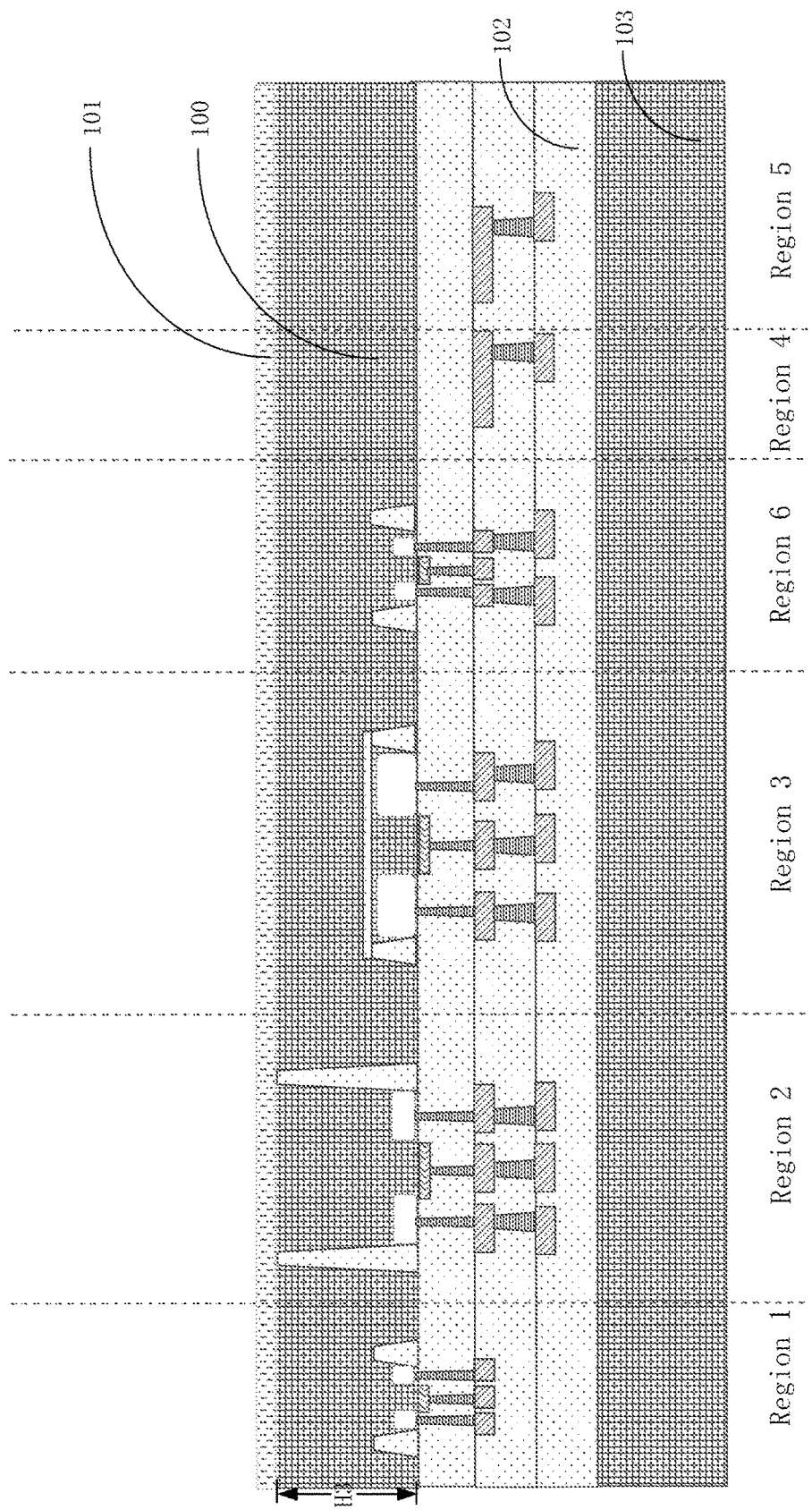

In FIG. 2F, the backside of substrate 100 is thinned to reduce the substrate thickness to H3. The thinning can be achieved by a conventional polishing or etching process that stops at stop layer 101. Subsequently, stop layer 101 is removed, for example, by an etching process.

Figure 2G:
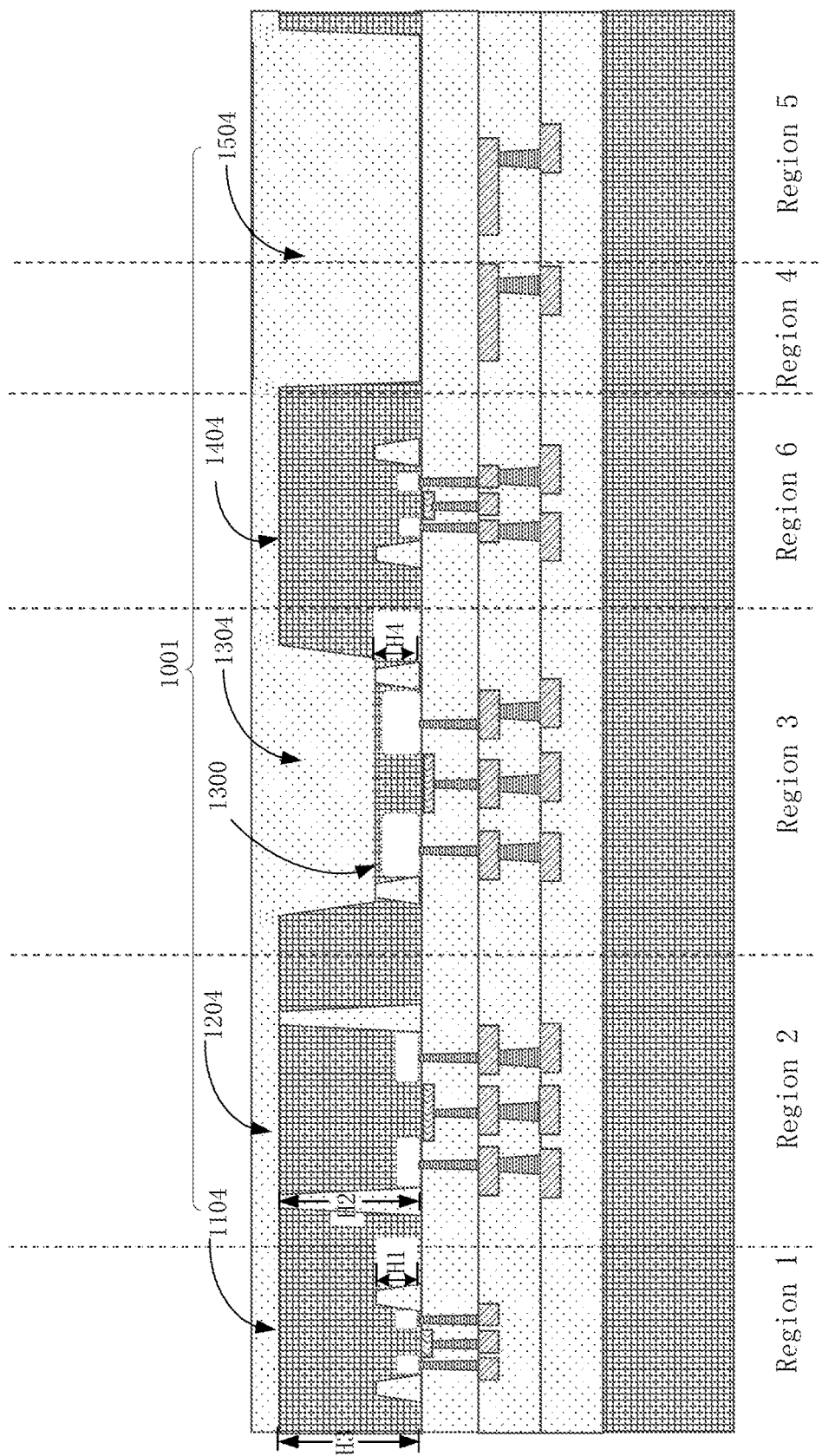

In FIG. 2G, a body dielectric layer 1001 is formed on the backside of substrate 100. First, an etch process is used to remove portions of the backside of substrate to form recessed regions in regions 3, 4, and 5. The recess in region 3 is at a depth to expose the island-shaped horizontal isolation layer 1300, and the recess region in regions 4 and 5 removes the portions of substrate 100 in regions 4 and 5. Next, a dielectric layer 1001 is deposited to cover the backside of the substrate and to fill the recessed regions. A planarization process, such as chemical mechanical polishing (CMP), is then used to form the planarized body dielectric layer 1001. As shown in FIG. 2G, planarized body dielectric layer 1001 includes portions 1104, 1204, and 1404 overlying the backside of the thinned substrate in regions 1, 2, and 6, respectively. Planarized body dielectric layer 1001 also includes protruding regions 1304 and 1504 filling the recessed regions in regions 3, 4, and 5 of the substrate.

Figure 2H:
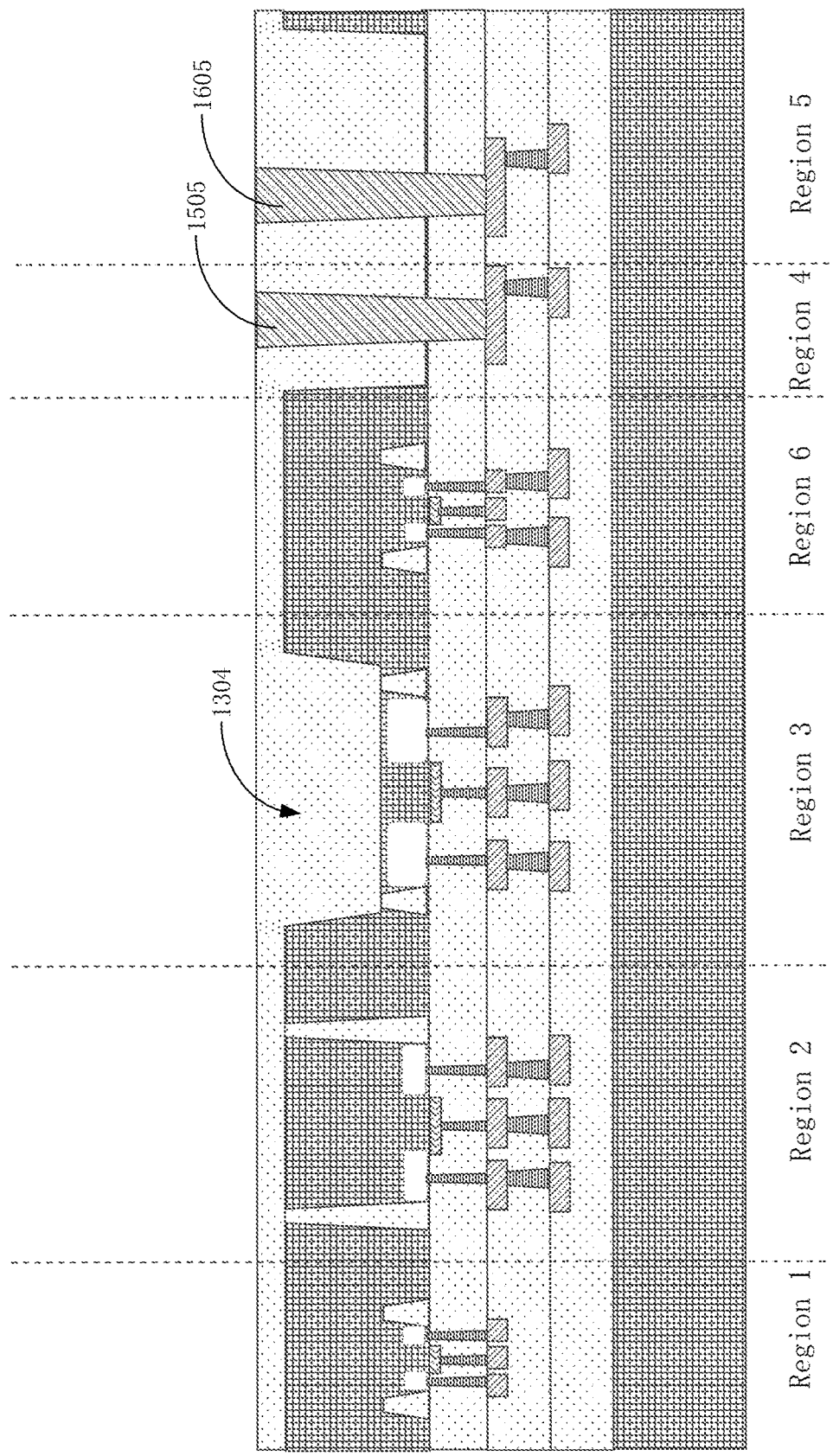

In FIG. 2H, one or more through semiconductor vias or through silicon vias (TSVs) 1505 and 1605 are formed through the portion of the body dielectric in regions 4 and 5 of the substrate. The one or more TSVs are used for connecting devices on both sides of the substrate. A standard etching and metal via forming process can be used.

Figure 2I:
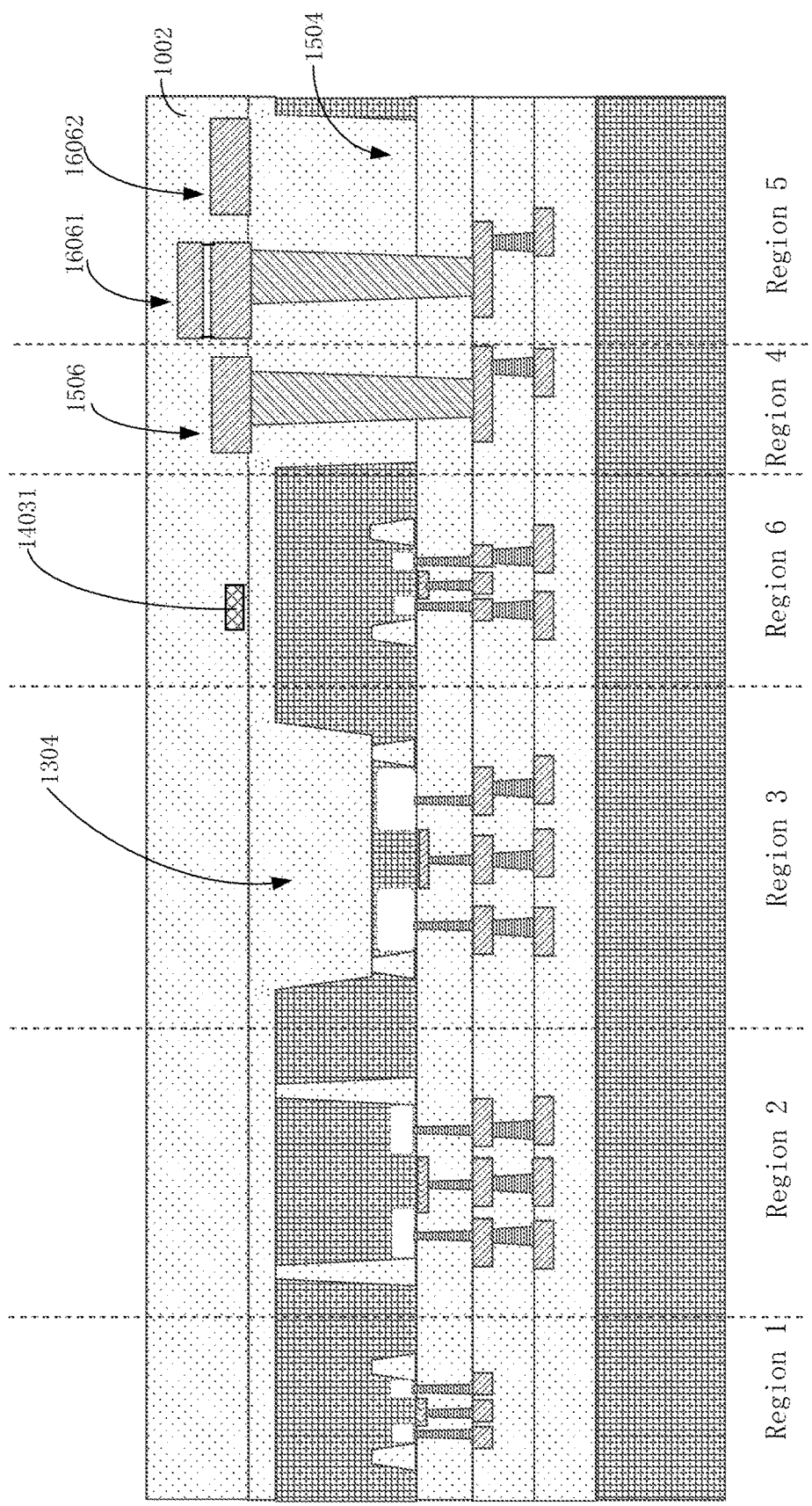

In FIG. 2I, integrated passive devices are formed. For example, one or more capacitors 16061 and one or more inductors 16062 are formed on body dielectric 1001. The capacitors can be a parallel-plate capacitor, with metal top plate and bottom plate as shown. In FIG. 2I, the capacitor and inductor are formed in a dielectric layer 1002 over dielectric layer 1001. In this embodiment, capacitor 16061 is connected to components on the front side of the substrate through TSV 1605. A bonding pad 1506 is formed on dielectric layer 1001 and connected to TSV 1505.

In some embodiments, MEMS structure 14031 is formed on dielectric layer 1001 before the formation of dielectric layer 1002. Alternatively, micro-electromechanical systems (MEMS) device 14032 is provided on a carrier substrate, the second semiconductor substrate 103 in the process shown in FIG. 2E and in the device structure of FIG. 1B. In embodiments of the invention, the micro-electromechanical systems (MEMS) devices may be formed in any other suitable location. For example, the MEMS device can be disposed between the surface of the semiconductor substrate and the second semiconductor substrate, such as a dielectric layer (e.g., an adhesive layer 102), on a dielectric layer on the second dielectric layer 1002 (e.g., interlayer dielectric or inter-metal layer dielectric). The MEMS can also be formed above a metal interconnect layer, over the transistors, or under the transistors. The MEMS device can also be formed in any of the six regions described above. Interconnects between the MEMS devices and other components of the integrated circuit can be formed using known methods and are not described here.

Figure 2J:
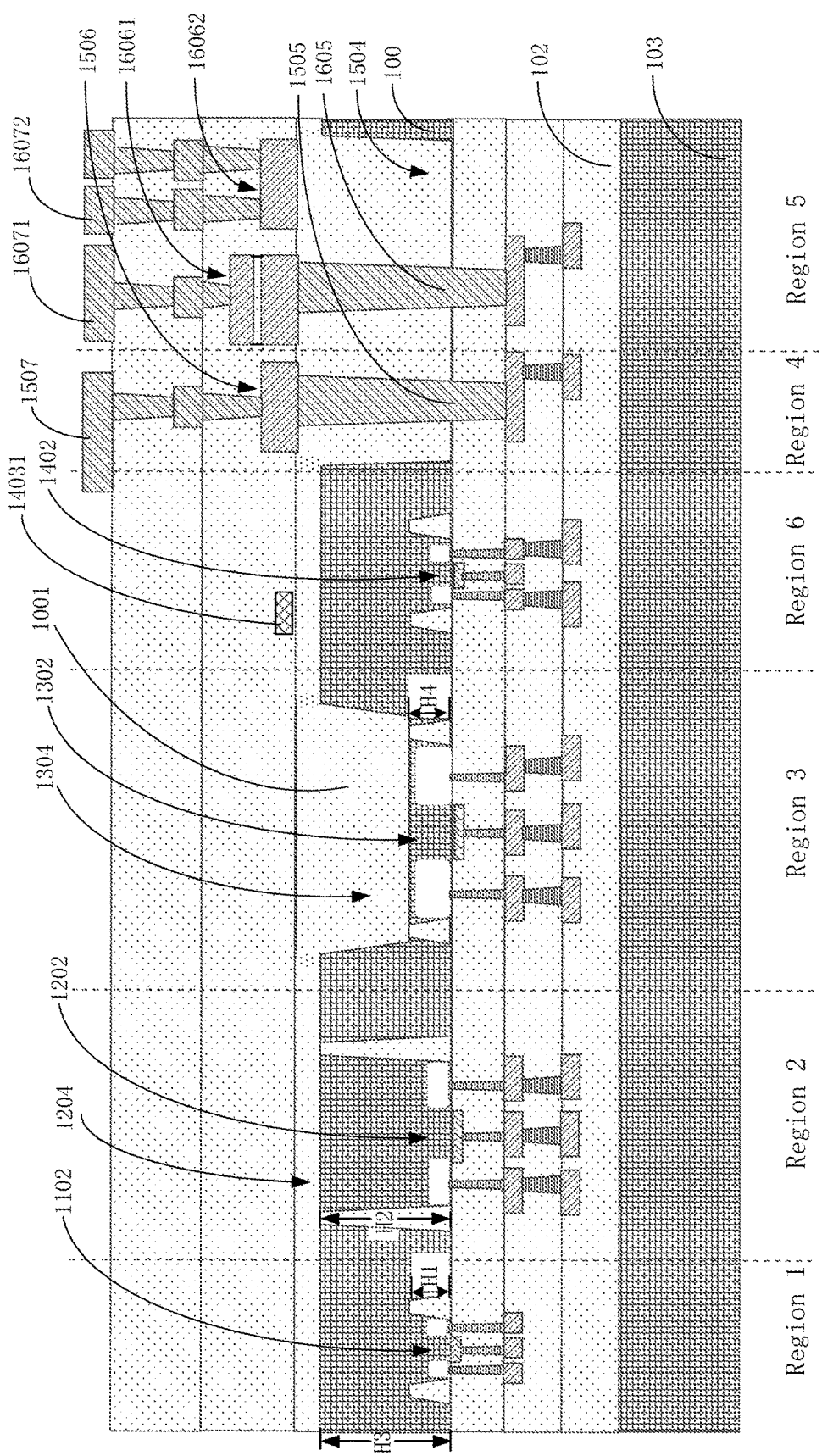

In FIG. 2J, bonding pad structures 1507, 16071, and 16072 are formed as external contacts for TSV 1505, capacitor 16061, and inductor 16062, respectively. The integrated circuit manufacturing process can further include dicing and packaging, etc.

FIG. 3 is a flowchart illustrating a method for manufacturing an integrated circuit according to an embodiment of the present invention. The method includes the following steps:

Step S101: Provide a first semiconductor substrate having a first surface and a second surface opposite to the first surface, said first semiconductor substrate having first, second, and third regions between the first and the second surfaces. Form a horizontal isolation layer in the third region and at a first depth from the first surface.

Step S102: Form one or more first shallow trench isolations (STIs) in the first region and one or more second STIs in the third region, the first and the second SITs are characterized by a first depth from the first surface. Form one or more first deep trench isolations (DTIs) in the second region, the first DTIs are characterized by a second depth from the first surface. The second depth is greater than the first depth.

Step S103: Form one or more first transistors, one or more second transistors, and one or more third transistors in the first substrate at the first surface side of the first substrate.

Step S104: Etch the first semiconductor substrate from the second surface to form a first recessed region to expose the horizontal isolation layer.

Step S105: Form a planarized body dielectric layer overlying the second surface of the first semiconductor substrate and filling the first recessed region.

Figure 4:
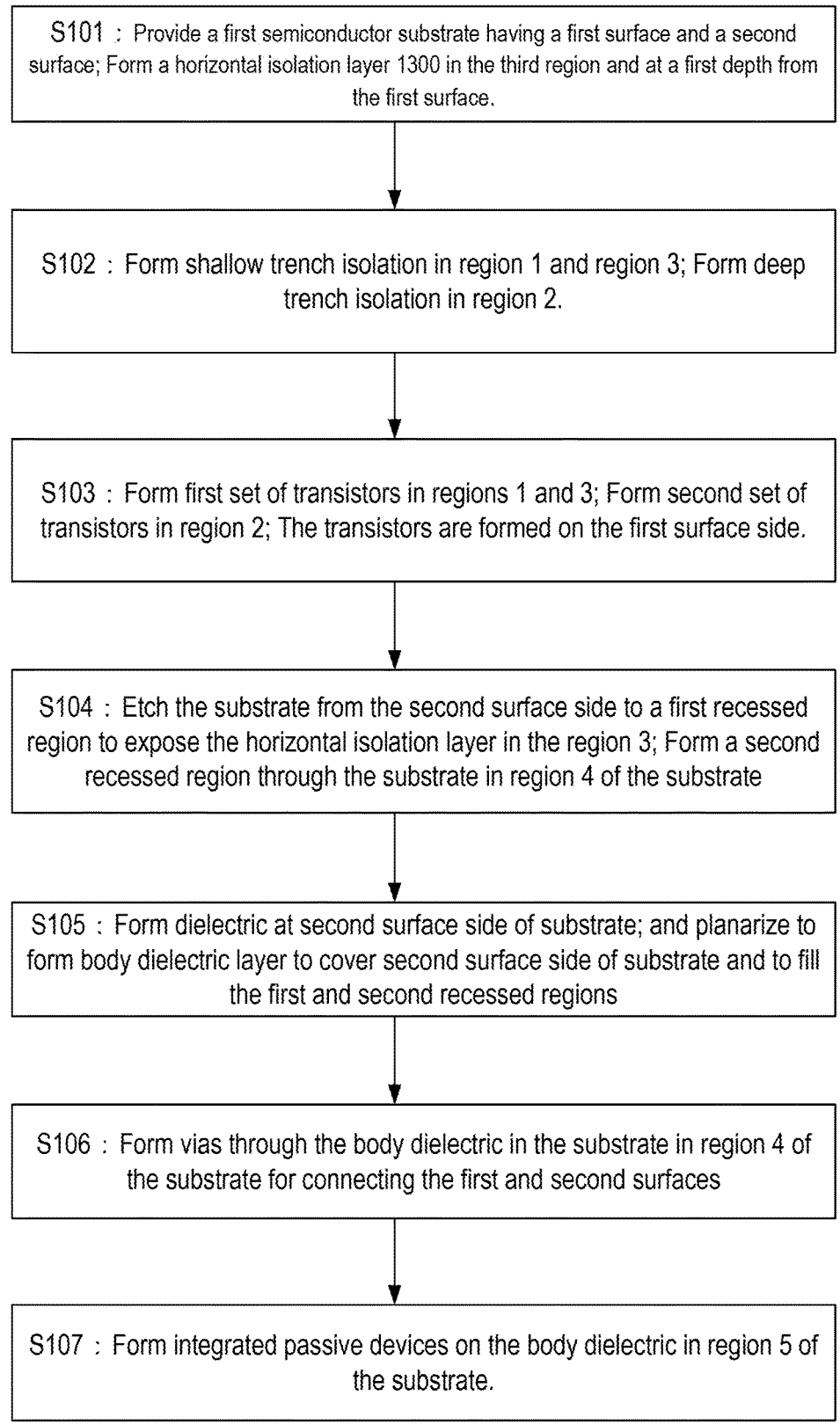
FIG. 4 is a flowchart illustrating a method for manufacturing an integrated circuit according to another embodiment of the present invention.

FIG. 4 is a flowchart illustrating a method for manufacturing an integrated circuit according to another embodiment of the present invention. The method includes steps S101 to S105 described above in connection with FIG. 3, and further includes the following steps:

In Step S104 and S105: The etching of the first semiconductor substrate from the second surface also forms a second recessed region in the fourth region of the first semiconductor substrate. The planarized body dielectric layer also fills the second recessed region.

Step S106: Form one or more through silicon vias (TSVs) in the fourth region between the first surface and the second surface of the first semiconductor substrate. The TSVs extend through the planarized body dielectric layer filling the second recessed region.

Step S107: Form one or more integrated passive devices on the planarized body dielectric layer at the second surface side of a fifth region of the first semiconductor substrate.

The present invention has been described by specific embodiments. However, it should be understood that the above embodiments are merely examples for of illustration purposes. They are not intended to limit the scope of the invention. In addition, it is understood that, according to the teachings of the present invention, variations and modifications can be made thereof, which will be within the spirit and purview of the present invention.

What is claimed is:

1. An integrated circuit, comprising:
 a first semiconductor substrate having a first surface and a second surface that is opposite to the first surface;
 one or more first trenches extending into the first semiconductor substrate from the first surface, the first trenches being characterized by a first depth;

one or more second trenches extending into the first semiconductor substrate from the first surface, the second trenches being characterized by a second depth greater than the first depth;

a thinned semiconductor region with a first recessed region extending in the first semiconductor substrate from the second surface, the thinned semiconductor region being characterized by a first thickness;

a second recessed region in the first semiconductor substrate extending from the second surface to the first surface; and a bulk dielectric layer covering the second surface of the first semiconductor substrate.

2. The integrated circuit of claim 1, further comprising a carrier substrate bonded to a second dielectric layer on the first surface of the first semiconductor substrate.

3. The integrated circuit of claim 1, wherein the bulk dielectric layer is in contact with the one or more second trenches to form a first active region isolated by dielectrics on sidewalls and at a bottom.

4. The integrated circuit of claim 3, further comprising a laterally-diffused MOS transistor in the first active region.

5. The integrated circuit of claim 1, wherein the bulk dielectric layer comprises:

a first protruding portion extending into the first recessed region; and a second protruding portion extending into the second recessed region.

6. The integrated circuit of claim 5, wherein the first protruding portion of the bulk dielectric layer is in contact with the one or more first trenches in the thinned semiconductor region to form a second active region isolated by dielectrics on sidewalls and at a bottom.

7. The integrated circuit of claim 5, further comprising a fully depleted silicon on insulator (SOI) transistor in the second active region.

8. The integrated circuit of claim 5, further comprising one or more conductive vias extending through the second protruding portion of the bulk dielectric layer.

9. The integrated circuit of claim 8, further comprising one or more of an integrated capacitor and one or more of an integrated inductor disposed on the second surface of the first semiconductor substrate.

10. The integrated circuit of claim 8, further comprising one or more MEMS (micro-mechanical-electrical-system) devices disposed on the second surface of the substrate.

11. The integrated circuit of claim 9, further comprising an interconnect structure for coupling the one or more of the integrated capacitor and the one or more of the integrated inductor to one or more components on the first surface of the substrate through one or more conductive vias disposed in the second protruding portion of the bulk dielectric layer.

12. The integrated circuit of claim 11, further comprising an interconnect structure for coupling the one or more of the MEMS devices to one or more components on the first surface of the first semiconductor substrate through one or more conductive vias disposed in the second protruding portion of the dielectric layer.

* * * * *